US008402403B2

(12) United States Patent
Letz et al.

(10) Patent No.: US 8,402,403 B2
(45) Date of Patent: Mar. 19, 2013

(54) VERIFYING A REGISTER-TRANSFER LEVEL DESIGN OF AN EXECUTION UNIT

(75) Inventors: Stefan Letz, Boeblingen (DE); Michelangelo Masini, Fellbach (DE); Juergen Vielfort, Althengstett (DE); Kai Weber, Holzgerlingen (DE)

(73) Assignee: International Business Machines Corporation, Armonk, NY (US)

( * ) Notice: Subject to any disclaimer, the term of this patent is extended or adjusted under 35 U.S.C. 154(b) by 31 days.

(21) Appl. No.: 12/946,325

(22) Filed: Nov. 15, 2010

(65) Prior Publication Data

US 2011/0154110 A1    Jun. 23, 2011

(30) Foreign Application Priority Data

Dec. 17, 2009   (EP) .................................... 09179697

(51) Int. Cl.
*G06F 17/50* (2006.01)
*G06F 9/455* (2006.01)
*G06G 7/62* (2006.01)

(52) U.S. Cl. ........ 716/106; 716/107; 716/108; 716/136; 703/13; 703/14; 703/15

(58) Field of Classification Search ........................ None
See application file for complete search history.

(56) References Cited

U.S. PATENT DOCUMENTS

| | | | | |
|---|---|---|---|---|
| 6,701,489 B1 * | 3/2004 | Lam | ............................... | 716/102 |
| 6,925,405 B2 * | 8/2005 | Adir et al. | ...................... | 702/119 |
| 6,931,611 B2 * | 8/2005 | Martin et al. | ................. | 716/107 |
| 6,993,736 B2 * | 1/2006 | Syed et al. | ...................... | 716/106 |
| 7,133,816 B2 * | 11/2006 | Adir et al. | ........................ | 703/14 |
| 7,143,376 B1 * | 11/2006 | Eccles | ............................ | 716/136 |
| 7,437,692 B2 * | 10/2008 | Oberlaender | ................. | 716/138 |
| 7,464,015 B2 * | 12/2008 | Iwashita | .......................... | 703/15 |
| 7,478,346 B2 * | 1/2009 | Hsu et al. | ....................... | 716/104 |
| 7,561,999 B2 * | 7/2009 | Iwamoto et al. | ................ | 703/14 |
| 7,865,793 B2 * | 1/2011 | Letz et al. | ...................... | 714/738 |
| 8,055,492 B2 * | 11/2011 | Adir | ................. | 703/13 |
| 2003/0115562 A1 * | 6/2003 | Martin et al. | ...................... | 716/5 |
| 2005/0102572 A1 * | 5/2005 | Oberlaender | .................... | 714/29 |
| 2005/0149805 A1 * | 7/2005 | Syed et al. | ..................... | 714/741 |

(Continued)

OTHER PUBLICATIONS

Adir et al., Genesys-Pro: Innovations in Test Program Generation for Functional processor Verification, IEEE Design and Test of Computers, pp. 84-93, Mar. 2004.*

(Continued)

*Primary Examiner* — A. M. Thompson
(74) *Attorney, Agent, or Firm* — Francis Lammes; Stephen J. Walder, Jr.; Libby Z. Toub (57) ABSTRACT

A mechanism is provided for verifying a register-transfer level design of an execution unit. A set of instruction records associated with a test case are generated and stored in a buffer. For each instruction record in the set of instruction records associated with the test case: the instruction record is retrieved from the buffer and sent to both a reference model and an execution unit in the data processing system. Separately, the reference model and the execution unit execute the instruction record and send results of the execution of the instruction record to a result checker in the data processing system. The result checker compares the two results and, responsive to a mismatch in the results, a failure of the test case is indicted, the verification of the test case is stopped, and all data associated with the test case is output from the buffer for analysis.

15 Claims, 5 Drawing Sheets

U.S. PATENT DOCUMENTS

| | | |
|---|---|---|
| 2005/0149898 A1 | 7/2005 | Hakewill et al. |
| 2007/0157134 A1 | 7/2007 | Cheng et al. |
| 2008/0028347 A1* | 1/2008 | Hiraoglu et al. .................. 716/5 |
| 2009/0070717 A1 | 3/2009 | Deutschle et al. |
| 2009/0241074 A1* | 9/2009 | Tanimoto .......................... 716/3 |

OTHER PUBLICATIONS

Watanabe et al., An SPU Reference Model for Simulation, Random Test Generation and Verification, Asia and South Pacific Conference on Design Automation, pp. 860-866, Jan. 2006.*

Adir et al., Adaptive Test Program Generation: Planning for the Unplanned, Seventh IEEE International High Level Design Validation and Test Workshop, pp. 83-88, Oct. 2002.*

Ghosh, Indradeep, "High Level Test Generation for Custom Hardware: An Industrial Perspective", IEEE, Proceedings of the 14th Asian Test Symposium (ATS '05), 2005, 1 page.

Murray, David, "Synthesizable Verification IP Speeds Design Cycle", EE Times, 2003, 10 pages.

Oddos, Yann et al., "MYGEN: Automata-Based On-line Test Generator for Assertion-Based Verification", Great Lakes Symposium on VLSI, Proceedings of the 19th ACM Great Lakes Symposium on VLSI, Boston Area, MA, USA, Session: Testing, 2009, pp. 75-80.

Zhang, Liang et al., "A Framework for Automatic Design Validation of RTL Circuits Using ATPG and Observability-Enhanced Tag Coverage", IEEE Transactions on Computer-Aided Design of Integrated Circuits and Systems, vol. 25, No. 11, Nov. 2006, pp. 2526-2538.

Zhigang, Yin et al., "A Novel RTL Behavioral Description Based ATPG Method", Journal of Computer Science and Technology, May 2003, vol. 18, No. 3, pp. 308-317.

* cited by examiner

VERIFYING A REGISTER-TRANSFER LEVEL DESIGN OF AN EXECUTION UNIT

BACKGROUND

The present invention relates in general to the field of simulating and verifying the logical correctness of a digital circuit design on a register-transfer level and in particular to verifying a register-transfer level, design of an execution unit.

Modern execution units have a complex structure and implement a very large instruction set. For example, floating-point units (FPUs) of IBM system z9 and z10 implement more then 330 instructions with 21 different instruction formats and over ten different precisions. To ensure maximum reliability of such execution units, verification has to cover as much of the relevant state space as possible.

Typically, simulation is used to verify sequences of instructions executed in a model simulation environment. To make full use of the limited time available, realistic and interesting test cases as well as high simulation performance are essential. However, current simulation methods lack at least one of these characteristics.

Generally, there are the following existing approaches so the simulation of an execution unit. A first approach is test case generation using random number generators. A simple program generates input vectors that are then simulated in a simulation environment with a software-based model simulator. However this creates no realistic test scenarios, uses no knowledge about data formats, architecture, etc and only low simulation performance can be achieved.

A second approach is test case generation using architecture test case generators. A sophisticated program implemented in a high-level programming language such as C/C++ generates test cases that take into account all necessary aspects of the underlying processor architecture. The resulting test cases are then simulated in a simulation environment, with a software-based model simulator. However the test case generation is slow and also only low simulation performance can be achieved.

In the Patent Application Publication US 2009/0070717 A1 "Method and system for generation coverage data for a switch frequency of HDL or VHDL signals" by Deutschle et al a method and system for generating coverage data for a switch frequency of HDL or VHDL signals is disclosed. The disclosed method and system for generating coverage data for a switch frequency of HDL or VHDL signals are using a filtering algorithm or filtering rules for signals occurring in the HDL or VHDL hardware description model that is present at the register-transfer level. The method for generating coverage data for a switch frequency of hardware description language (HDL) signals, comprises the steps of providing a HDL hardware description model, within a register transfer level, providing a filtering algorithm for signals occurring in the HDL hardware description model, extracting signals from the HDL hardware description model, according to the filtering algorithm in order to get relevant signals, performing a simulation process on a compiled representation of the HDL hardware description model, performing a checking routine for the relevant signals in every cycle and storing the relevant signals in a data base.

Usually, the drivers, monitors, and checkers of the simulation environments are also written in high-level programming languages and thus are separate from the simulation model. This degrades simulation performance even further.

Using so-called hardware accelerators (e.g., AWAN machines) instead of software-based model simulators would improve the simulation performance drastically. However, this approach does not work well with the existing software-based test case generators and separate drives, monitors, and checkers. The simulation process would be slowed down and any potential performance benefit would be negated.

BRIEF SUMMARY

In one illustrative embodiment, a method, in a data processing system, is provided for verifying a register-transfer level design of an execution unit. The illustrative embodiment generates a set of instruction records associated with a test case The illustrative embodiment stores the set of instruction records in a buffer. For each instruction record in the set of instruction records associated with the test case, the illustrative embodiment: retrieves the instruction record from the buffer; sends the instruction record to both a reference model, and an execution unit in the data processing system, wherein the reference model is reference for a register-transfer level design and wherein the execution unit is a new register-transfer level design to be verified; executes separately, by the reference model and the execution unit, the instruction record; sends separately, by the reference model and the execution unit, results of the execution of the instruction record to a result checker in the data processing system; compares the results of the execution of the instruction record from both the reference model and the execution unit; responsive to a mismatch in the results, indicates a failure of the test case to the test case generator; stops the verification of the test case; and outputs all data associated with the test case from the buffer for analysis.

In other illustrative embodiments, a computer program product comprising a computer useable or readable medium having a computer readable program is provided. The computer readable program, when executed on a computing device, causes the computing device to perform various ones, and combinations of, the operations outlined above with regard to the method illustrative embodiment.

In yet another illustrative embodiment, a data processing system is provided. The data processing system may comprise one or more processors and a memory coupled to the one or more processors. The memory may comprise instructions which, when executed by the one or more processors, cause the one or more processors to perform various ones, and combinations of, the operations outlined above with regard to the method illustrative embodiment.

These and other features and advantages of the present invention will be described in, or will become apparent to those of ordinary skill in the art in view of, the following detailed description of the example embodiments of the present invention.

BRIEF DESCRIPTION OFT HE SEVERAL VIEWS OF THE DRAWINGS

A preferred embodiment of the invention, as described in detail below, is shown in the drawings, in which.

DETAILED DESCRIPTION

It will be readily understood that the components of the present invention, as generally described and illustrated in the Figures herein, may be arranged and designed in a wide variety of different configurations. Thus, the following detailed description of the embodiments of the apparatus, system, and method of the present invention, as presented in the Figures, is not intended to limit the scope of the invention, as claimed, but merely representative of selected embodiments of the invention.

Reference throughout this specification to "a select embodiment," "one embodiment," or "an embodiment" means that a particular feature, structure, or characteristic described in connection with the embodiment is included in at least one embodiment of the present invention. Thus, appearances of the phrases "a select embodiment," "in one embodiment," or "in an embodiment" in various places throughout this specification are not necessarily referring to the same embodiment.

The illustrated embodiment of the invention will be best understood by reference to the drawings, wherein like part are designated by like numerals throughout. The following description is intended only by way of example, and simply illustrates certain select embodiments of devices, systems, and processes that are consistent with the invention as claimed herein.

Figure 1:
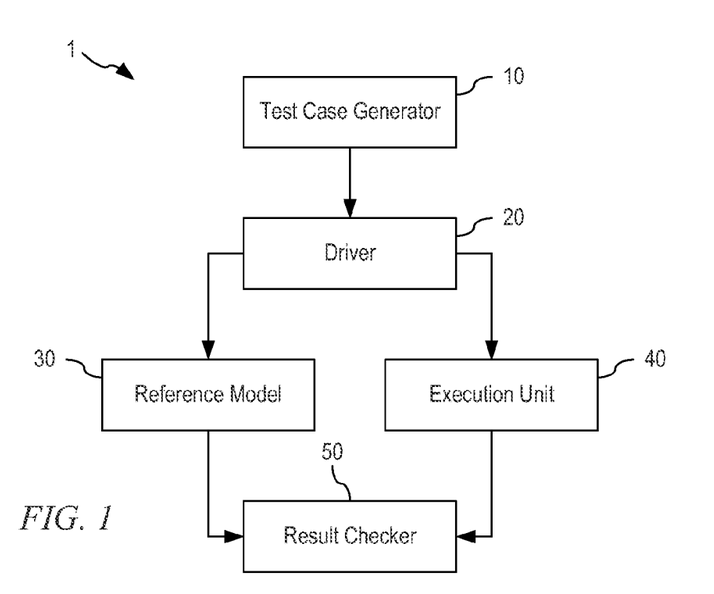
FIG. 1 is a schematic block diagram of a simulation environment to verify a register-transfer level design of an execution unit in accordance with an illustrative embodiment.

FIG. 1 shows a simulation environment 1 to verify a register-transfer level design of an execution unit 40, in accordance with an illustrative embodiment.

Referring to FIG. 1 the simulation environment 1 to verify the register-transfer level design of the execution unit 40 comprises a test case generator 10, a driver 20, and a reference model 30 for the execution unit 40, and a result checker 50.

According to the invention the test case generator 10, the driver 20, the reference model 30 for the execution unit 40 and the result checker 50 are written in a hardware description language, and compiled directly in a simulation model of the simulation environment 1. The driver 20 uses test case data produced by the test case generator 10 to feed the execution unit 40, like a floating-point unit (FPU), fixed-point unit (FixPU) or any other data manipulating unit, and the reference model 30. When results are available from both the execution unit. 40 and the reference model 30, the result checker 50 compares both results and flags an error if there is a difference.

Like the execution unit 40, the test case generator 10, the driver 20, the reference model 30, and the result checker 50 are implemented in a synthesizable hardware description language such as Very High Speed Integrated Circuits Hardware Description Language (VHDL) and are inserted into the design, i.e., the sources from which the simulation model 1 is compiled, as VHDL modules. Embodiments of the inventive simulation environment 1 are not limited to running on hardware accelerators such as the ANAN machines. They can also be executed using software-based model simulators, e.g., the IBM MESA simulator and, with minor changes, field-programmable gate array (FPGA) chips.

Figure 2:
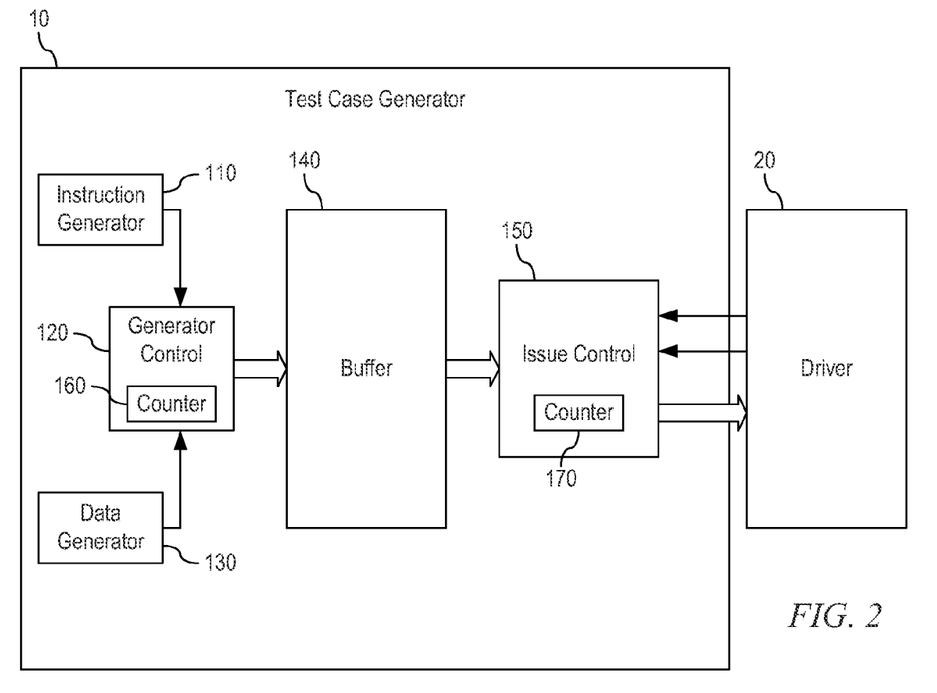
FIG. 2 is a schematic block diagram of a test case generator for the simulation environment to verify a register-transfer level design of an execution unit of FIG. 1 in accordance with an illustrative embodiment.
Figure 3:
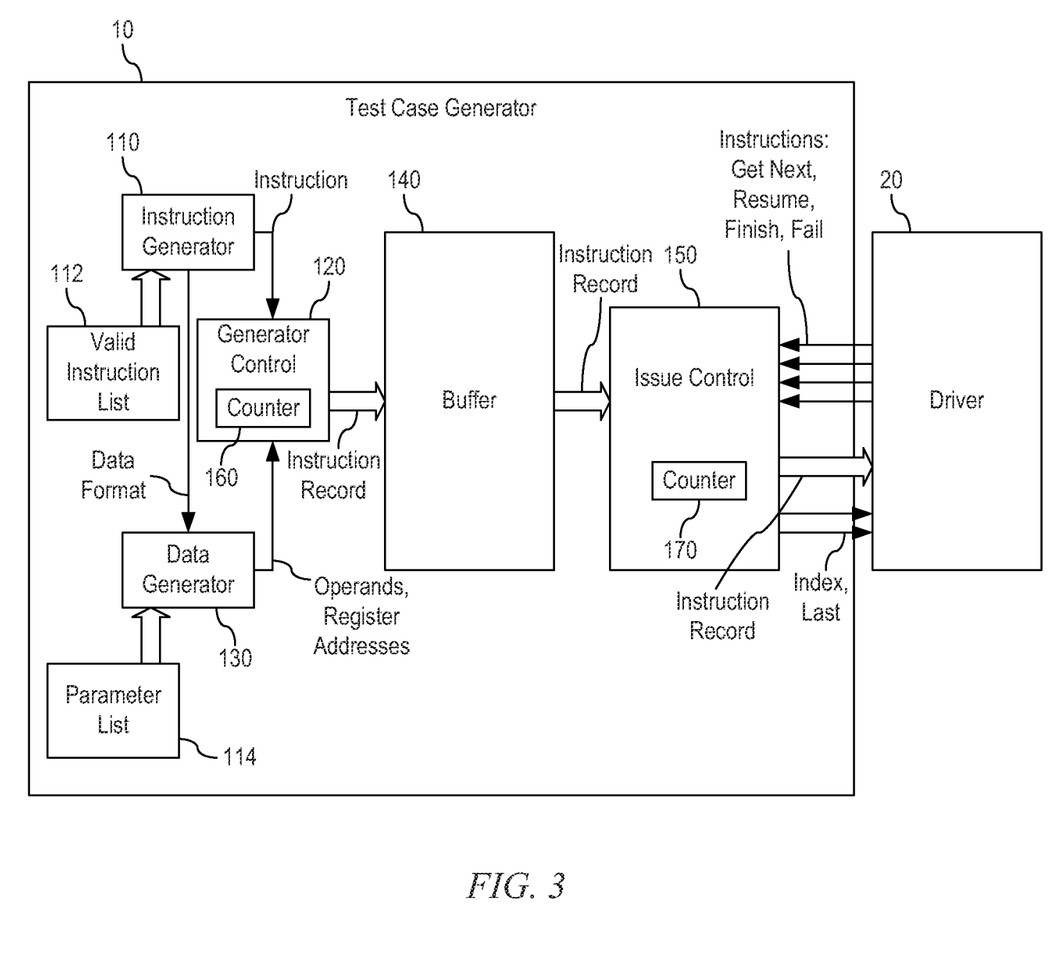
FIG. 3 is a more detailed block diagram of the test case generator of FIG. 2 in accordance with an illustrative embodiment.
Figure 4:
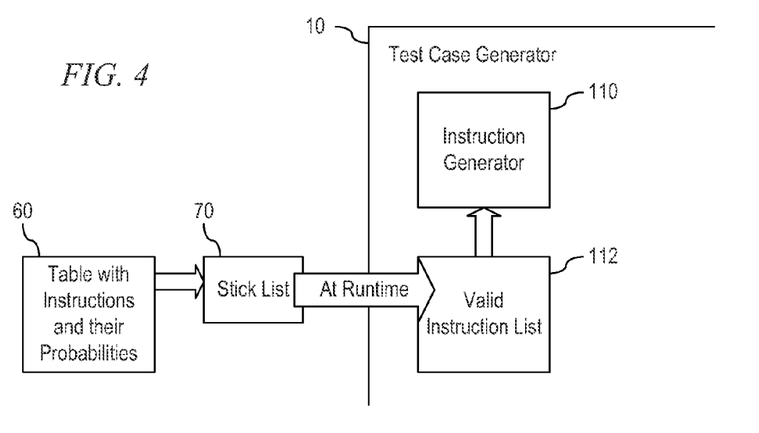
FIG. 4 is a more detailed block diagram showing a part of the test case generator of FIG. 3 to explain how instructions for the test case generator are generated in accordance with an illustrative embodiment.
Figure 5:
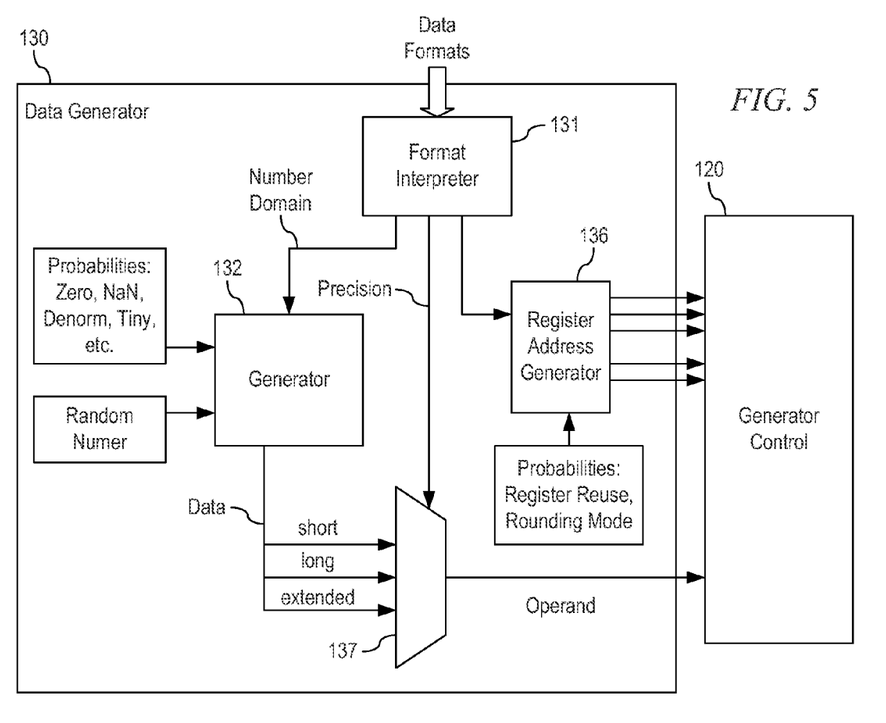
FIG. 5 is a more detailed block diagram of a data generator for the test case generator of FIG. 3 in accordance with an illustrative embodiment.

FIG. 2 shows the test case generator 10 for the simulation environment 1 in greater detail in accordance with an illustrative embodiment; FIG. 3 is a more detailed block diagram of the test case generator 10 of FIG. 2 in accordance with an illustrative embodiment; FIG. 4 is a more detailed block diagram showing a part of the test case generator 10 of FIG. 3 to explain how instructions for the test case generator 10 are generated in accordance with an illustrative embodiment; and FIG. 5 is a more detailed block diagram of a data generator 130 for the test case generator 10 of FIG. 3 in accordance with an illustrative embodiment.

Referring to FIGS. 2 to 5 the test case generator 10 comprises an instruction generator 110, a data generator 130, a generation control block 120, a buffer 140 and an issue control block 150 such that instructions and data generated by the test case generator 10 can be used as input for the reference model 30 of the execution unit 40 and the design of the execution unit 40.

The generation of instruction records, which form the instruction stream that is simulated, is decoupled from their issue to the driver 20, from where they are issued to the execution unit 40 and the reference model 30. Thus, the generation of instruction records and the storing of these instruction records into the buffer 140 run in parallel to the actual execution of the corresponding instructions in the execution unit 40 and the reference model 30.

The test case generator 10 has a simple interface to the user, i.e., a verification engineer, and the driver 20. The user provides a list 112 of valid instructions and can set certain parameters to configure the test case generation. The driver 20 requests the next instruction record via "get next" instruction, for example. Furthermore, it can request older instruction records in order to support so-called stalls, rejects, kills, and flushes, which require certain instructions of the instruction stream to be re-issued.

In each simulation cycle, the instruction generator 110 randomly selects an instruction based on a so-called valid instruction list 112 that contains all valid instructions along with their probabilities. Referring to FIG. 4 the valid instruction list 112 is initialized by so-called sticks 70 which are provided by the user and loaded into the simulation model 1 at runtime. These sticks 70 can be generated from table 60 with instructions and their probabilities, e.g., a text file or a spreadsheet, in an automated fashion, e.g., by a small script.

The valid instruction list 112 can be changed without recompiling the simulation model 1, which usually is a very time-consuming step. By modifying the valid instruction list 112, the user is able to easily target specific scenarios.

The instruction generator 110 contains knowledge about memory/general-purpose-register (GPR) input operands an instruction requires. After randomly selecting a valid instruction, the instruction generator 110 sends the corresponding data format information to the data generator 130. The instruction generator 110 sends the instruction's so-called operation code (opcode) to the generation control block 120.

When a new test case begins, the instruction generator 110 automatically produces one load instruction for each register in the execution unit 40, e.g., for the floating-point registers in a floating point unit. This initializes both the execution unit 40 and the reference model 30 to the same state and provides an easy way to store the initial register values in the buffer 140.

Referring to FIG. 5, the data generator 130 comprises a format interpreter 131, a generator 132, a register address generator 136 and a multiplexer 137. The data generator 130 is producing up to two memory/GPR input operands in the data format(s) required by the instruction that was generated by the instruction generator 110. Furthermore, the data generator 130 selects the floating-point-register (FPR) addresses created by the register address generator 136, and further instruction-specific fields defined by the processor architecture, if any.

A data format comprises an instruction format, a precision, and a number domain. The instruction formats are defined in the processor architecture and specify the number of operands, usually between zero and three, the order of these operands, and their location, e.g. memory, FPR, GPR, etc. The precision defines the length of an operand, e.g., short with 32 bits, long with 64 bits, and extended with 128 bits, by controlling the multiplexer 137. The number domain specifies how the operand data is encoded, e.g., binary fixed-point, binary-coded decimal (BCD), binary floating-point (BFP), hexadecimal floating-point (RFP), decimal floating-point (DFP). But not all combinations of instruction format, precision, and number domain are valid.

The user can control the data generator 130 through a set of probabilities, e.g., the probability of generating a zero, a positive number, an infinity, etc.; the probability of reusing register addresses; the probability of instruction-specific rounding modes. The probabilities are set via sticks 70 that are loaded into the simulation model 1 at runtime.

The generation control block 120 combines the instruction's operation code generated by the instruction generator 110 and the information provided by the data generator 130 into an instruction record. The instruction record is a set of all processor-architecture-level information associated with an instruction. The instruction record contains all information the driver needs to drive the execution unit 40 and the reference model 30.

For example, the instruction record comprises an operation code providing the instruction's operation code as defined by the processor architecture, memory/GPR operands providing memory/GPR operands for the instruction, register address providing addresses of the registers used by the instruction, further fields providing further instruction-specific input data as defined by the processor architecture, if required, and control registers providing settings of control register that are relevant for the instruction, e.g., IEEE exception enable bits and rounding modes, if required.

The generation control block 120 contains a counter 160 that counts how many instructions records have been stored into the buffer 140. Each cycle, until the pre-defined number of instructions per test case is reached, the generation control block 120 stores a new instruction record into the buffer 140 and increments the counter 160. Once all instructions of the current test case have been generated, i.e., the counter 160 equals the pre-defined number of instructions per test case, the generation control block 120 does not store further instruction records and waits until the next test case begins. When a new test case begins, the counter 160 is reset to zero.

The buffer 140 stores the generated instruction records. Each of the instruction records can be written by the generation control block 120 and read by the issue control block 150 at the same time. The number of entries in the buffer 140 is the product of the pre-defined number of instructions per test case and a pre-defined number of test cases. This allows the buffer 140 to store not only the current test case but also a certain number of test cases generated and simulated before the current one. This is essential when investigating fails that are caused by instructions or events in previous test cases.

The issue control block 150 is the interface of the test case generator 10 to the driver 20. The issue control block 150 contains a counter 170 that gives the index of the next instruction record to be given to the driver 20. When the driver 20 signals "get next", the issue control block 150 sends the next instruction record plus its index and a "last" flag, and increments the counter 170. When the driver 20 needs to re-issue previous instructions, e.g., due to a kill or a flush, the driver 20 signals "resume" along with the index of the required instruction record. The issue control block 150 sets its counter 170 to this index and returns the corresponding instruction record plus index and "last" flag. When the last instruction has successfully completed its execution in both execution unit 40 and reference model 30, the driver 20 signals "finish", the issue control Nock 150 resets it counter 170 to zero, and the test case generator 10 begins generating the next test case.

If the result checker 50 sees a mismatch between the results of execution unit 40 and reference model 30, or an error occurs in the execution unit 40, the driver 20 will signal "fail". This causes the test case generator 10 to raise a certain internal, fail signal and stop modifying the buffer 140 for a pre-defined number of cycles. A small, external fail collect program, which is triggered in an interval that matches the pre-defined number of cycles, monitors the internal fail signal. If the signal is active, the test case generator 10 reads out all data in the buffer 140, i.e., the current test case and a certain number of previous test cases, and writes this data into a file. After waiting the pre-defined number of cycles, the test case generator 10 lowers its internal fail signal and begins generating the next test case.

Since the external fail collect program is only called in a certain interval, the performance impact is minimal. The data contained in the file written by the fail collect program allows the user to reproduce and analyze failing test cases in another, software-based simulation environment, which could reuse parts of the simulation environment 1 described herein.

Figure 6:
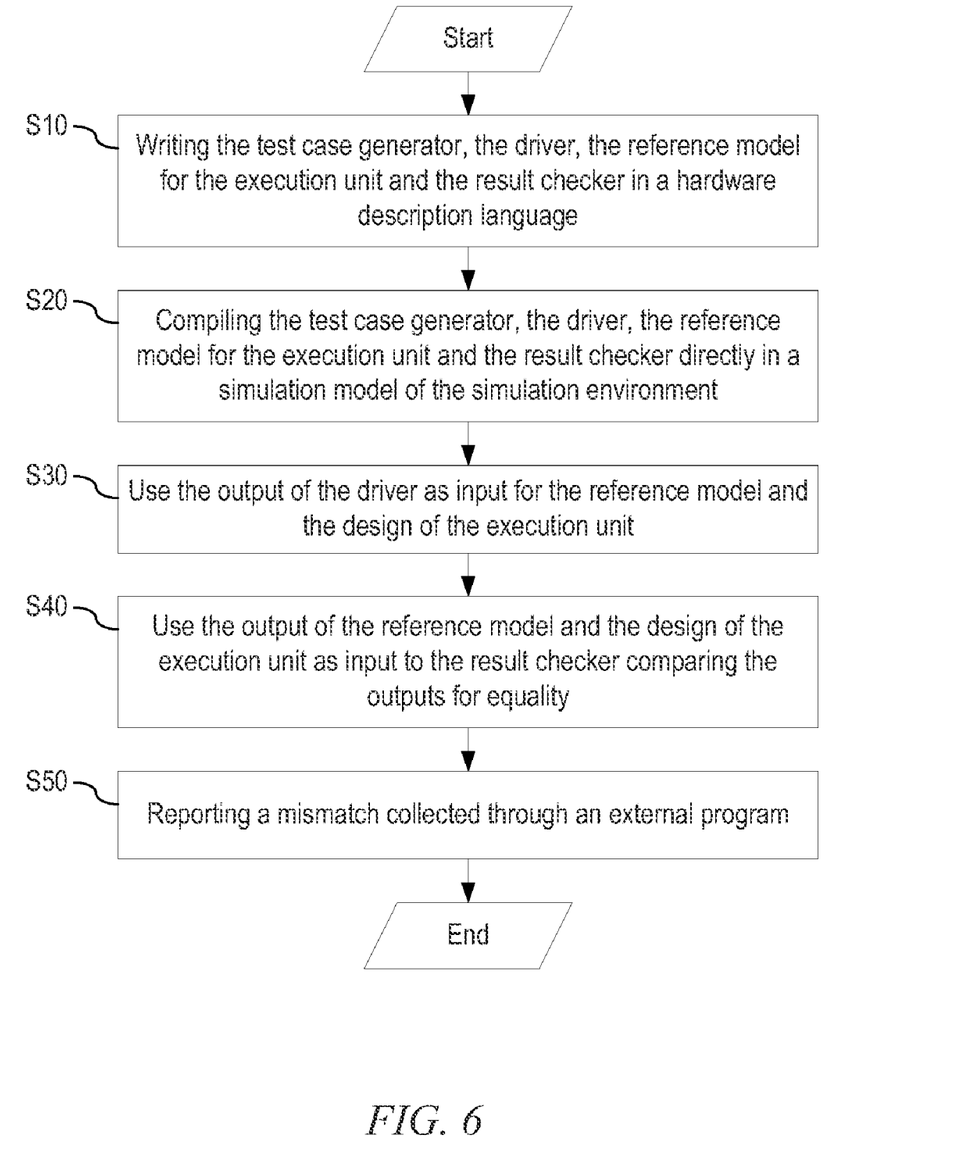
FIG. 6 is a schematic flow chart of a method to verify a register-transfer level design of an execution unit, in accordance with an illustrative embodiment.

FIG. 6 is a schematic flow chart of a method to verify a register-transfer level design of an execution unit, in accordance with an illustrative embodiment.

Referring to FIG. 6 the flowchart depicts how the simulation environment 1 to verify a register-transfer level design of an execution unit 40 will be used. According to step S10 the test case generator 10, the driver 20, the reference model 30 for the execution unit 40 and the result checker 50 are written in a hardware description language. In Step 320 the test case generator 10, the driver 20, the reference model 30 for the execution unit 40 and the result checker 50 are compiled directly in a simulation model of the simulation environment 1. In step S30 an output of the driver 20 is used as input for the reference model 30 of the execution unit 40 and the design of the execution unit 40. In step S40 an output of the reference model 30 of the execution unit 40 and an output of the design of the execution unit 40 are used as input of the result checker 50 comparing the outputs of the design of the execution unit 40 and the reference model 30 of the execution unit 40 for equality. In step S50 a mismatch is reported and collected through an external program.

Figure 7:
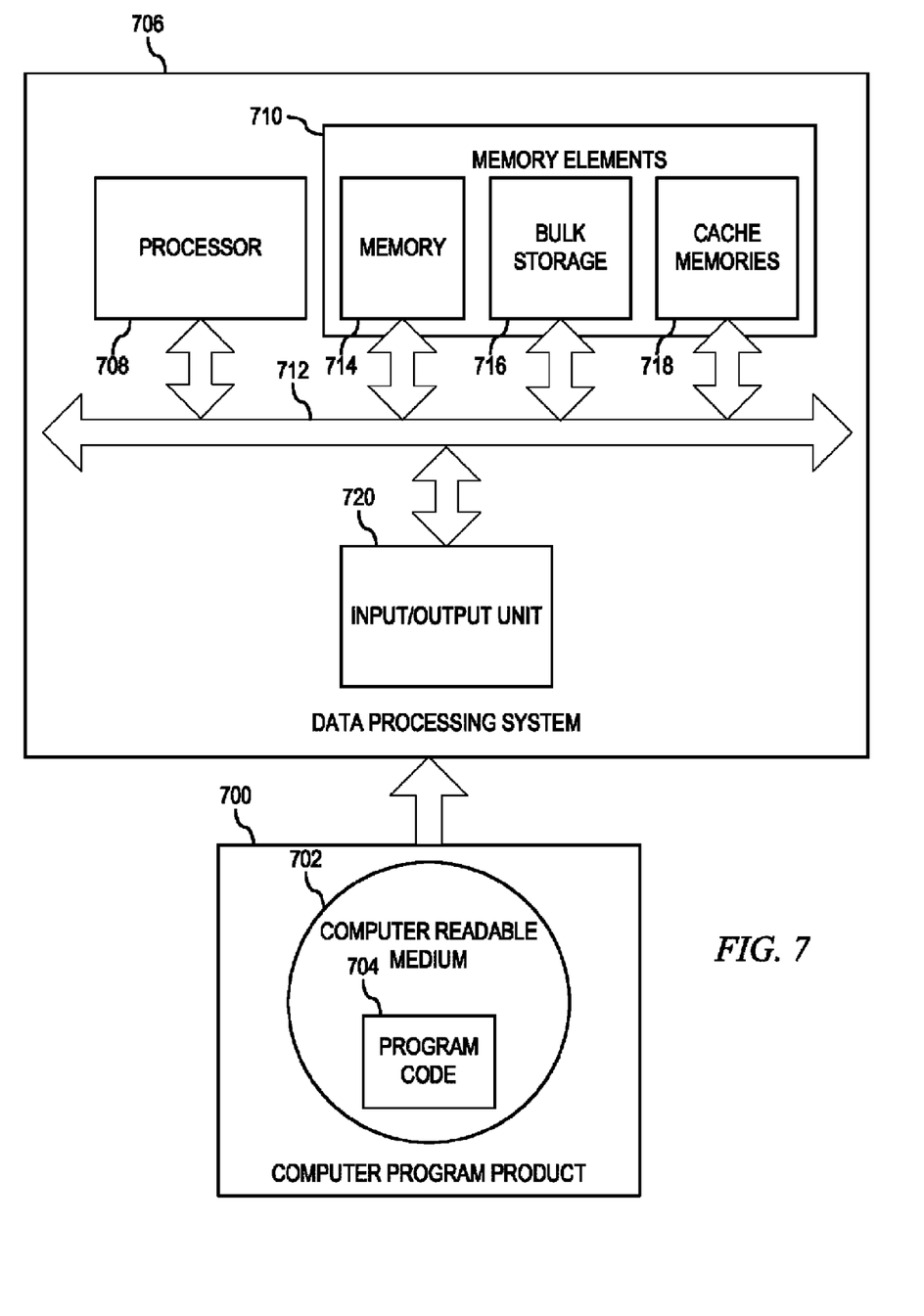
FIG. 7 illustrates a computer program product accessible from a computer-usable or computer-readable medium providing program code for use by or in connection with a data processing system comprising a processor and memory.

Furthermore, FIG. 7 illustrates that embodiments of the present invention can take the form of a computer program product 700 comprising a computer-usable or computer-readable medium 702 storing program code 704 for use by or in connection with a data processing system 706 or any instruction execution system. For the purposes of this description, a computer-usable or computer-readable medium can be any apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk, and an optical disk. Current examples of optical disks include compact disk-read only memory (CD-ROM), compact disk-read/write (CD-R/W), and DVD. The data processing system 706 suitable for storing and/or executing program code 704 will include at least one processor 708 coupled directly or indirectly to memory elements 710 through a system bus 712. The memory elements 710 can include local memory 734 employed during actual execution of the program code, bulk storage 716, and cache memories 718 which provide temporary storage of at least some program code in order to reduce the number of times code must be retrieved from bulk storage during execution. Input/output or I/O devices 720 (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modems, and Ethernet cards, are just a few of the currently available types of network adapters.

Embodiments of the present invention achieve advantageously a very high simulation performance and thus high coverage of state space. The test case generator is able to produce realistic test scenarios that can be controlled by user-defined settings. These user-defined settings can be modified at runtime. Test case generator, driver, reference model, and result checker are separated blocks, which allows easy reuse. Failing test cases can be reproduced in other, software-based simulation environments.

What is claimed is:

1. A method, in a data processing system, for verifying a register-transfer level design of an execution unit the method comprising:
   generating, by a test case generator in the data processing system, as set of instruction records associated with a test case, wherein generating the set of instructions associated with the test case further comprises:
      receiving, by an instruction generator in the test case generator, a list of instructions and a set of parameters from a user, wherein the set of parameters are used to configure the test case generator;
      randomly selecting, by the instruction generator, an instruction from the list of instructions;
      sending, by the instruction generator, an operation code associated with the random instruction to a generator control in the test case generator;
      sending, by the instruction generator, a data format associated with the random instruction to a data generator in the test case generator;
      producing, by the data generator, one or more input operands in the data format received from the instruction generator;
      selecting, by the data generator, one or more register addresses from set of register addresses;
      sending, by the data generator, the one or more register addresses and the one or more input operands to the generator control;
      combining, by the generator control, the operation code, the one or more register addresses, and the one or more input operands into an instruction record; and
      storing, by the generator control, the instruction record in the buffer, wherein storing the instruction record in the buffer further comprises:
         incrementing, by the generator control, a counter as each instruction record in the set of instruction records is stored in the buffer;
         determining, by the generator control, whether all of the instruction records for the test case have been stored in the buffer; and
         responsive to all of the instruction records for the test case being stored in the buffer, stopping, by the test case generator, generation of the instruction records for the test case;
   storing, by the test case generator, the set of instruction records in a buffer; and
   for each instruction record in the set of instruction records associated with the test case:
      retrieving, by a device driver in the data processing system, the instruction record from the buffer;
      sending, by the device driver, the instruction record to both a reference model and an execution unit in the data processing system, wherein the reference model is reference for a register-transfer level design and wherein the execution unit is a new register-transfer level design to be verified;
      executing separately, by the reference model and the execution unit, the instruction record;
      sending separately, by the reference model and the execution unit, results of the execution of the instruction record to a result checker in the data processing system;
      comparing, by the result checker, the results of the execution of the instruction record from both the reference model and the execution unit;
      responsive to a mismatch in the results, indicating, by the result checker, a failure of the test cast to the test case generator;
      stopping, the test case generator, the verification of the test case; and
      outputting, by the test case generator, all data associated with the test case from the buffer for analysis.

2. The method of claim 1, further comprising;
   responsive to all instruction records executing in the reference model and the execution unit without a mismatch in the results, indicating, by the test case generator, a finish of the test cast.

3. The method of claim 1, wherein the set of register addresses are created by a register address generator in the test case generator and wherein the creation of the set of register addresses are based on a set of probabilities.

4. The method of claim 3, wherein the set of probabilities are at least one of a probability of generating a zero, a probability of generating a positive number, probability of generating an infinity, a probability of reusing register addresses, or a probability of instruction-specific rounding modes.

5. The method of claim 1, wherein the data format comprises an instruction format, a precision, and a number domain, wherein the instruction formats are defined in a processor architecture and specify the number of operands, the order of the operands, and a location of each operand, wherein the precision defines the length of each operand, and wherein the number domain specifies how operand data is encoded.

6. A data processing system for verifying a register-transfer level design of an execution unit, the data processing system comprising:
   a processor; and
   a memory coupled to the processor, wherein the memory comprises instructions which, when executed by the processor, cause the processor to:
   generate a set of instruction records associated with a test case, wherein the instructions to generate the set of instructions associated with the test case further cause the processor to:
      receive a list of instructions and a set of parameters from a user, wherein the set of parameters are used to configure the test case generator;
      randomly select an instruction from the list of instructions;
      send an operation code associated with the random instruction to a generator control in the test case generator;
      send a data format associated with the random instruction to a data generator in the test case generator;
      produce one or more input operands in the data format received from the instruction generator;
      select one or more register addresses from a set of register addresses;
      send the one or more register addresses and the one or more input operands to the generator control;
      combine the operation code, the one or more register addresses, and the one or more input operands into an instruction record; and
      store the instruction record in the butler, wherein the instructions to store the instruction record in the buffer further cause the processor to:
         increment a counter as each instruction record in the set of instruction records is stored in the buffer;
         determine whether all of the instruction records for the test case have been stored in the buffer; and
         responsive to all of the instruction records for the test case being stored in the buffer, stop generation of the instruction records for the test case;
   store the set of instruction records in a buffers and
   for each instruction record in the set of instruction records associated with the test case:
      retrieve the instruction record from the buffer;
      send the instruction record to both a reference model and an execution unit in the data processing system, wherein the reference model is reference for a register-transfer level design and wherein the execution unit is a new register-transfer level design to be verified;
      execute separately, by the reference model and the execution unit, the instruction record;
      send separately, by the reference model and the execution unit, results of the execution of the instruction record to a result checker in the data processing system;
      compare the results of the execution of the instruction record from both the reference model and the execution unit;
      responsive to a mismatch in the results, indicate a failure of the test case the test case generator;
      stop the verification of the test case; and
      output all data associated with the test case from the buffer for analysis.

7. The data processing system of claim 6, wherein the instructions further cause the processor to responsive to all instruction records executing in the reference model and the execution unit without a mismatch in the results, indicate a finish of the test case.

8. The data processing system of claim 6, wherein the set of register addresses are created by a register address generator in the test case generator and wherein the creation of the set of register addresses are based on a set of probabilities.

9. The data processing system of claim 8, wherein the set of probabilities are at least one of a probability of generating a zero, a probability of generating a positive number, probability of generating an infinity, a probability of reusing register addresses, or a probability of instruction-specific rounding modes.

10. The data processing system of claim 6, wherein the data format comprises an instruction format, a precision, and a number domain, wherein the instruction formats are defined in a processor architecture and specify the number of operands, the order of the operands, and a location of each operand, wherein the precision defines the length of each operand, and wherein the number domain specifies how operand data is encoded.

11. A computer program product comprising a computer readable storage medium having a computer-readable program stored therein, wherein the computer-readable program, when executed on a computer, causes the computer to:
   generate a set of instruction records associated with a test case, wherein the computer-readable program to generate the set of instructions associated with the test case further causes the computer to:
      receive a list of instructions and a set of parameters from a user, wherein the set of parameters are used to configure the test case generator;
      randomly select an instruction from the list of instructions;
      send an operation code associated with the random instruction to a generator control in the test case generator;
      send a data format associated with the random instruction to a data generator in the test case generator;
      produce one or more input operands in the data format received from the instruction generator;
      select one or more register addresses from a set of register addresses;
      send the one or more register addresses and the one or more input operands to the generator control;
      combine the operation code, the one or more register addresses, and the one or more input operands into an instruction record; and
      store the instruction record in the buffer, wherein the computer-readable program to store the instruction record in the buffer further causes the computer to:
         increment a counter as each instruction record in the set of instruction records is stored in the buffer;
         determine whether all of the instruction records for the test case have been stored in the buffer; and
         responsive to all of the instruction records for the test case being stored in the buffer; stop generation of the instruction records for the test case;

store the set of instruction records in a buffer; and for each instruction record in the set of instruction records associated with the test case:

retrieve the instruction record from the buffer;

send the instruction record to both a reference model and an execution unit in the data processing system, wherein the reference model is reference for a register-transfer level design and wherein the execution unit is a new register-transfer level design to be verified;

execute separately, the reference model and the execution unit, the instruction record;

send separately, by the reference model and the execution unit, results of the execution of the instruction record to a result checker in the data processing system;

compare the results of the execution of the instruction record from both the reference model and the execution unit;

responsive to a mismatch in the results, indicate a failure of the test case to the test case generator;

stop the verification of the test case; and output all data associated with the test case from the buffer for analysis.

12. The computer program product of claim 11, wherein the computer-readable program further causes the computer to:

responsive to all instruction records executing in the reference model and execution unit without a mismatch in the results, indicate a finish of the test case.

13. The computer program product of claim 11, wherein the set of register addresses are created by a register address generator in the test case generator and wherein the creation of the set of register addresses are based on a set of probabilities.

14. The computer program product of claim 13, wherein the set of probabilities are at least one of a probability of generating a zero, a probability of generating a positive number, probability of generating an infinity, a probability of reusing register addresses, or a probability of instruction-specific rounding modes.

15. The computer program product of claim 11, wherein the data format comprises an instruction format, a precision, and a number domain, wherein the instruction formats are defined in a processor architecture and specify the number of operands, the order of the operands, and a location of each operand, wherein the precision defines the length of each operand, and wherein the number domain specifies how operand data is encoded.

* * * * *